United States Patent
Searles et al.

(10) Patent No.: US 7,869,287 B2
(45) Date of Patent: Jan. 11, 2011

(54) CIRCUIT FOR LOCKING A DELAY LOCKED LOOP (DLL) AND METHOD THEREFOR

(75) Inventors: Shawn Searles, Austin, TX (US); Faisal A. Syed, Austin, TX (US); Nicholas T. Humphries, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 313 days.

(21) Appl. No.: 12/059,593

(22) Filed: Mar. 31, 2008

(65) Prior Publication Data

US 2009/0244995 A1   Oct. 1, 2009

(51) Int. Cl.
G11C 7/00 (2006.01)

(52) U.S. Cl. .................... 365/194; 365/193; 365/233.1; 365/233.19

(58) Field of Classification Search ................. 365/193, 365/194, 233.1, 233.19
See application file for complete search history.

(56) References Cited

U.S. PATENT DOCUMENTS

| 5,373,255 | A  | 12/1994 | Bray et al. |
| 5,440,515 | A  | 8/1995  | Chang et al. |
| 5,857,095 | A  | 1/1999  | Jeddeloh et al. |
| 6,691,214 | B1 | 2/2004  | Li et al. |
| 6,791,889 | B2 | 9/2004  | Peterson |
| 6,930,932 | B2 | 8/2005  | Rentschler |
| 7,038,971 | B2 * | 5/2006 | Chung ................... 365/189.16 |
| 7,061,941 | B1 | 6/2006  | Zheng |
| 7,117,381 | B2 | 10/2006 | Kim et al. |
| 7,184,323 | B2 | 2/2007  | Fujisawa |
| 7,321,525 | B2 | 1/2008  | Matsui |
| 7,457,174 | B2 * | 11/2008 | Braun et al. ................. 365/193 |
| 7,487,378 | B2 | 2/2009  | Morein et al. |
| 7,518,946 | B2 | 4/2009  | Iwasaki |
| 2002/0147892 | A1 | 10/2002 | Rentschler et al. |
| 2002/0147896 | A1 | 10/2002 | Rentschler et al. |

(Continued)

FOREIGN PATENT DOCUMENTS

WO    2008063199 A1    5/2008

OTHER PUBLICATIONS

"Double Data Rate (DDR) SDRAM Specification," JESD79, Release 2, JEDEC Solid State Technology Association, JEDEC Standard, Electronics Industries Alliance, May 2002.

(Continued)

*Primary Examiner*—VanThu Nguyen

(57) ABSTRACT

A receive circuit (320) includes a DLL core (510), a latch (326), and a DLL control circuit (520). The DLL core (510) has a first input for receiving a DLL clock signal, a second input for receiving a delay line select signal, and an output for providing a delayed data strobe signal. The latch (326) has a signal input for receiving an external data signal, a control input coupled to the output of the DLL core (510), and an output for providing an internal data signal. The DLL control circuit (520) provides the DLL clock signal to the first input of the DLL core (510) responsive to a memory data strobe signal while the receive circuit is in a first mode, and provides the DLL clock signal to the first input of the DLL core (510) responsive to a processor clock signal while the receive circuit (320) is in a second mode.

20 Claims, 3 Drawing Sheets

U.S. PATENT DOCUMENTS

| | | |
|---|---|---|
| 2003/0021164 A1 | 1/2003 | Yoo et al. |
| 2004/0143775 A1 | 7/2004 | Li et al. |
| 2005/0197082 A1 | 9/2005 | Agostinelli |
| 2005/0204245 A1 | 9/2005 | Lee et al. |
| 2005/0243608 A1 | 11/2005 | Lee |
| 2006/0114742 A1 | 6/2006 | Salmont et al. |
| 2006/0133158 A1 | 6/2006 | Shin |
| 2007/0217559 A1 | 9/2007 | Stott et al. |
| 2009/0086562 A1 | 4/2009 | Richards |
| 2009/0244996 A1 | 10/2009 | Searles et al. |
| 2009/0244997 A1 | 10/2009 | Searles et al. |
| 2009/0245010 A1 | 10/2009 | Searles et al. |
| 2009/0296501 A1 | 12/2009 | Searles |

OTHER PUBLICATIONS

International Search Report in application No. PCT/US2009/003220 mailed Sep. 15, 2009, 12 pages.

U.S. Appl. No. 12/059,613, Office Action mailed Apr. 7, 2010, 6 pages.

U.S. Appl. No. 12/059,641, Office Action mailed Apr. 1, 2010, 14 pages.

U.S. Appl. No. 12/059,653, Notice of Allowance mailed Apr. 29, 2010, 14 pages.

U.S. Appl. No. 12/059,613, Final Office Action mailed Jul. 27, 2010, 9 pages.

U.S. Appl. No. 12/059,641, Notice of Allowance mailed Aug. 19, 2010, 10 pages.

U.S. Appl. No. 12/059,653, Notice of Allowance mailed Aug. 10, 2010, 11 pages.

U.S. Appl. No. 12/127,059, Non-Final Office Action mailed Sep. 2, 2010, 8 pages.

U.S. Appl. No. 12/059,641, Notice of Allowance mailed Nov. 22, 2010, 10 pages.

* cited by examiner

CIRCUIT FOR LOCKING A DELAY LOCKED LOOP (DLL) AND METHOD THEREFOR

CROSS REFERENCE TO RELATED APPLICATIONS

Related subject matter is contained in the following copending applications:

Application Ser. No. 12/059,613, filed Mar. 31, 2008, entitled "CIRCUIT USING A SHARED DELAY LOCKED LOOP (DLL) AND METHOD THEREFOR" invented by Shawn Searles, Nicholas T. Humphries, and Faisal A. Syed and assigned to the assignee hereof.

Application Ser. No. 12/059,641, filed Mar. 31, 2008, entitled "DATA DRIVER CIRCUIT FOR A DYNAMIC RANDOM ACCESS MEMORY (DRAM) CONTROLLER OR THE LIKE AND METHOD THEREFOR" invented by Shawn Searles, Nicholas T. Humphries, and Faisal A. Syed and assigned to the assignee hereof.

Application Ser. No. 12/059,653, filed Mar. 31, 2008, entitled "METHOD FOR TRAINING DYNAMIC RANDOM ACCESS MEMORY CONTROLLER TIMING DELAYS" invented by Shawn Searles, Tahsin Askar; Thomas Hamilton, and Oswin Housty, and Faisal A. Syed and assigned to the assignee hereof.

Application Ser. No. 12/127,059, filed May 27, 2008, entitled "METHOD AND APPARATUS FOR IMPLEMENTING WRITE LEVELIZATION IN MEMORY SUBSYSTEMS" invented by Shawn Searles et al. and assigned to the assignee hereof.

FIELD OF THE DISCLOSURE

The invention relates generally to interface circuits, and more particularly to interface circuits that use delay locked loops (DLLs).

BACKGROUND

A data processing system includes a central processing unit (CPU) that executes instructions and thereby manipulates data. The instructions and data are stored in a memory system, which is typically isolated from the CPU. The CPU interacts with the memory system through a memory interface. The functioning of the memory interface is predominantly under the control of the CPU, and is performed by a memory controller. The memory controller can be integrated tightly with the CPU, such as on the same silicon chip as the CPU, or it can be included with other components of the data processing system, one such component often referred to as a northbridge chipset.

There are many types of memory. One type is referred to as dynamic random access memory (DRAM). A DRAM system can include several known types of DRAM, of which double data rate (DDR) is an example. One may refer to the memory controller that governs the interface to the DRAM system as a DRAM controller. Furthermore, one may refer to a memory controller that interfaces a CPU to DDR DRAM as a DDR DRAM controller.

DDR DRAM conforms to industry standard electrical and protocol standards set forth by the Joint Electron Devices Engineering Councils (JEDEC). These standards define how the contents of the DRAM is accessed (read), and stored (written). The DDR family of standards has now been enhanced to include standards known as DDR2 and DDR3.

The interface to any of these DDR DRAMs is accomplished primarily through two signal classes, DQ (data) and DQS (data clock).

The JEDEC standard interface specifies that during a read operation, the DDR DRAM will issue these two signal classes at the same time, a manner commonly referred to as "edge aligned". In order for the DRAM controller to correctly acquire the data being sent from the DDR DRAM, the DRAM controller typically utilizes a delay-locked loop (DLL) circuit to delay the DQS signal so that it can be used to correctly latch the DQ signals. For similar reasons, the DRAM controller also utilizes DLL circuits to center the outgoing data on transitions of DQS.

A DLL must lock to a reference signal to keep the delay of the output signal substantially constant over process, voltage, and temperature variations. Some DLLs continuously maintain lock to a reference signal, whereas others intermittently lock to a reference signal while continuously using the voltage of the loop filter to set the delay, since this voltage decays slowly. During the time that the DLL is reacquiring lock, it cannot be also supporting a read operation so system performance is diminished.

Known DLLs have addressed this problem in several ways. One solution is to duplicate the receive DQS DLL and alternate between the two DLLs (sometimes referred to as a "Gatling gun" solution). While one DLL is reacquiring lock, the other is receiving and delaying DQS. Periodically, the two DLLs are swapped so that the DLL that has just reacquired lock is used to delay DQS and the other DLL can now be connected to the reference clock and it can reestablish lock. This solution is costly since it requires an extra DLL for each data nibble of DRAM controller transceiver, resulting in higher system cost and ultimately lower system performance.

Another similar solution also involves a second DLL that is constantly maintaining lock to a reference clock signal. This second DLL is often called a replica DLL. The first DLL permanently receives the DQS signal and the delay cells therein receive the feedback control bias voltage from the loop filter of the replica DLL, such that the first DLL maintains approximate lock to the replica DLL. The first DLL does not require a phase detector or loop filter because the required feedback control bias voltage is provided by the replica DLL. This solution not only has the disadvantages of a duplicated DLL, but also suffers from decreased performance since the replica DLL cannot track the second DLL perfectly.

Yet another solution involves periodically pausing the read transaction for a time adequate to reestablish lock using a reference clock signal. After the receive DQS DLL has once again established lock, then the read transaction can be restarted. This solution has the disadvantage of lowering system performance.

BRIEF SUMMARY

In one form, the present invention provides a dynamic random access memory (DRAM) controller including a delay locked loop (DLL) core and a DLL control circuit. The DLL core has a first input for receiving a DLL clock signal, a second input for receiving a delay line select signal, an enable input, and an output for providing a delayed memory data strobe signal. The DLL control circuit is coupled to the DLL core to provide the DLL clock signal to the first input of the DLL core responsive to a memory data strobe signal during read cycles, and for providing the DLL clock signal to the first input of the DLL core responsive to a processor clock signal during cycles other than read cycles, and for enabling the DLL core to lock during at least a portion of the read cycles.

In another form the present invention provides a receive circuit including a DLL core, a latch, and a DLL control circuit. The DLL core has a first input for receiving a DLL clock signal, a second input for receiving a delay line select signal, and an output for providing a delayed data strobe signal. The latch has a signal input for receiving an external data signal, a control input coupled to the output of the DLL core, and an output for providing an internal data signal. The DLL control circuit provides the DLL clock signal to the first input of the DLL core responsive to a memory data strobe signal while the receive circuit is in a first mode, and provides the DLL clock signal to the first input of the DLL core responsive to a processor clock signal while the receive circuit is in a second mode.

In yet another form, an external data signal is received in a first mode of operation. An external data strobe signal that times the external data signal is received in the first mode of operation. The external data signal is latched during the first mode of operation using an output of a DLL to provide an internal data signal. The DLL is locked using external data strobe signal during the first mode of operation. An internal clock signal is received during a second mode of operation. The DLL is locked using the internal clock signal during the second mode of operation.

BRIEF DESCRIPTION OF THE DRAWINGS

The present disclosure may be better understood, and its numerous features and advantages made apparent to those skilled in the art by referencing the accompanying drawing, in which like reference numbers indicate similar or identical items, and in which.

DETAILED DESCRIPTION

Figure 1:
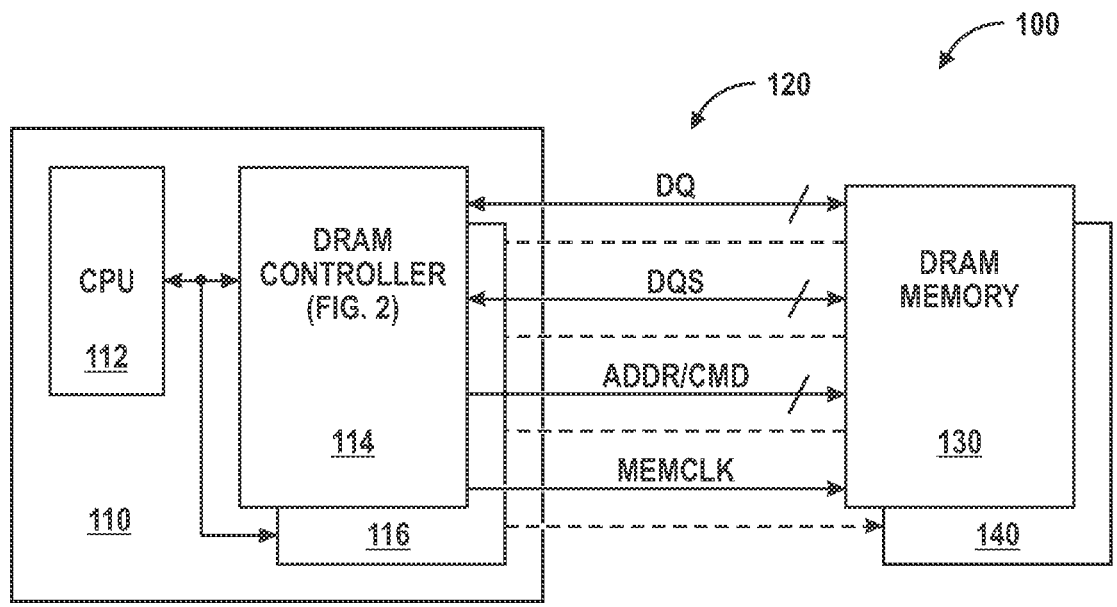
FIG. 1 illustrates in block diagram form a data processing system according to the present invention.

FIG. 1 illustrates in block diagram form a data processing system 100 according to the present invention. Data processing system 100 includes generally a microprocessor 110, a memory interface 120, and memories 130 and 140. Microprocessor 110 includes generally a central processing unit (CPU) 112, and dynamic random access memory (DRAM) controllers 114 and 116. CPU 112 has a bidirectional interface to DRAM controllers 114 and 116 for conducting address, data, and control signals. DRAM controllers 114 and 116 are also connected to memory interface 120 and each has an input/output terminal for conducting a memory data signal labeled "DQ", an input/output terminal for conducting a memory data strobe signal labeled "DQS", an output terminal for providing address and command information labeled "ADD/CMD", and an output terminal for providing a clock signal labeled "MEMCLK". Memory devices 130 and 140 are connected to microprocessor 110 via memory interface 120, and each has an input/output terminal for conducting DQ, an input/output terminal for conducting DQS, an input terminal for receiving ADD/CMD, and an input terminal for receiving MEMCLK. While the following discussion references only DRAM controller 114 and memory 130, it should be appreciated that DRAM controller 116 and memory 140 are interconnected over memory interface 120 and operate in the same way, and a data processing system can include any number of DRAM controllers and corresponding memories consistent with the principles set forth herein.

Microprocessor 110 is a single-chip data processor that includes CPU 112 as the CPU of system 100. CPU 112 executes stored program instructions and exchanges data with input output devices (not shown in FIG. 1). Note that as shown in FIG. 1, CPU 112 includes other functions such as caches, memory management units, and the like but for ease of discussion these are combined into CPU 112. Memory interface 120 is commonly referred to as the physical or PHY interface.

When CPU 112 performs a write cycle to memory 130, it provides address, control, and data signals to DRAM controller 114. DRAM controller 114 receives the request from CPU 112, and performs a write operation with memory 130 via interface 120. The memory write operation results in the memory location, indicated by the specified address, being updated with the data value supplied by CPU 112. The command portion of signal ADD/CMD informs memory 130 that a write operation is to be performed. Memory data strobe signal DQS identifies to memory 130 when data DQ is ready to be written into the memory.

When CPU 112 performs a read cycle to memory 130, it provides address and control signals to DRAM controller 114. DRAM controller 114 receives the request from CPU 112, and performs a read operation with memory 130 via interface 120. The command portion of signal ADD/CMD informs memory 130 that a read operation is to be performed. The read operation accesses memory 130 at the specified address and memory 130 responds by providing DRAM controller 114 with the requested data DQ and also provides memory data strobe signal DQS which informs DRAM controller 114 that the requested data is available. After completing the read operation, DRAM controller 114 provides the requested data to CPU 112.

Memory 130 is implemented with double data rate (DDR) memory. Specifically, DRAM controller 114 supports either DDR2 or DDR3 memory. In other embodiments, DRAM controller 114 can easily be modified to support other versions of the DDR standard and other forms of DRAM. Moreover, DRAM controller 114 can also be modified to support other types of memory such as DDR static random access memory (SRAM), DDR flash memory, and the like.

According to the DDR standard, read and write transactions are performed in bursts, in which the address provided by signal ADD/CMD represents the first location of a series of sequential locations that will be read or that will be written to. Memory data strobe information conveyed by signal DQS is represented as a differential voltage waveform on two conductors. The command portion of signal ADD/CMD is used to request that a read or write transaction is to be performed, but is also used to initiate other types of operations including reset, refresh, and others, as described in the DDR standard.

Since memory 130 is a DDR memory, it transmits memory data strobe signal DQS during a read cycle nominally aligned with transitions of data signal DQ. During a write cycle, DRAM controller 114 transmits memory data strobe signal DQS nominally centered on the transitions of data signal DQ. Despite these requirements on the timing of DQS relative to DQ, the physical distance between memory 130 and microprocessor 110 and the relatively high speed of operation cause DQS to arrive at an arbitrary phase with respect to DQ. The use of DQS in this manner creates the need to individually delay the outgoing DQ and DQS signals during a write operation, and to delay the incoming DQS signals during a read operation. If DDR memory 130 uses memory chips organized as by-four ("×4") memories, then memory 130 requires the provision of two differential DQS signal pairs for each byte of data, because both DQS signal pairs must be individually delayed to match the characteristics of their respective chips. DRAM controller 114 also must generate a read-enable signal to synchronize the start of a read operation to avoid spuriously latching data before it is available. Generation of such a read enable signal also requires its own delay circuit.

The time delay required by each of the delay circuits must be individually determined. DRAM controller 114 performs a calibration procedure after power is initially supplied to data processing system 100 and reset is performed. DRAM controller 114 performs this calibration under the control of a basic input/output system (BIOS) prior to CPU 112 executing any application programs, to determine the appropriate delay values. DRAM controller 114 stores the individual delay values in registers, and these values in turn control the time delay provided by their corresponding delay circuits.

Forming all these delays requires a substantial amount of circuit area. DRAM controller 114 requires a total of five delays in order to support reading and writing each byte of data, two for the write path and three for the read path. Moreover, DRAM controller 114 supports a 64-bit wide bus with an additional eight bits of error correcting code (ECC). Thus DRAM controller 114 requires a total of forty-five separate delays. DRAM controller 116 requires the same number of delays, and this same number of delays would be required for each additional DRAM controller used.

Moreover DRAM controller 114 utilizes delay locked loop (DLL) circuits to provide these appropriate delays. Unfortunately, a DLL circuit is a very expensive component of a DRAM controller. The DLL circuit is physically large, increasing cost both due to the area of silicon involved, and due to lower manufacturing yield. Each DLL circuit also consumes significant electrical power, which ultimately limits system performance and increases operating cost. Especially because DRAM controller 114 requires five delays for each byte of data, the physical layout topology of a set of five DLL circuits is inefficient, resulting in even higher silicon area costs.

Figure 2:
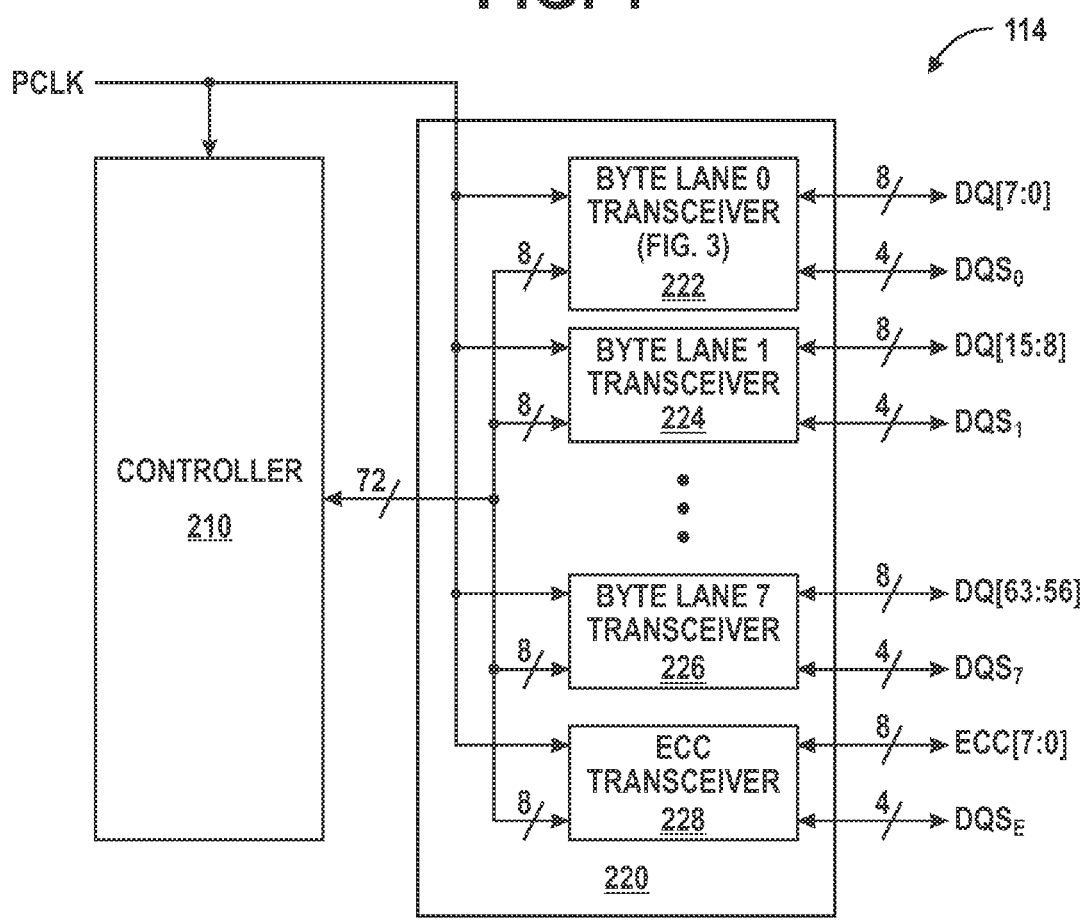
FIG. 2 illustrates in block diagram form the DRAM controller of FIG. 1.
Figure 3:
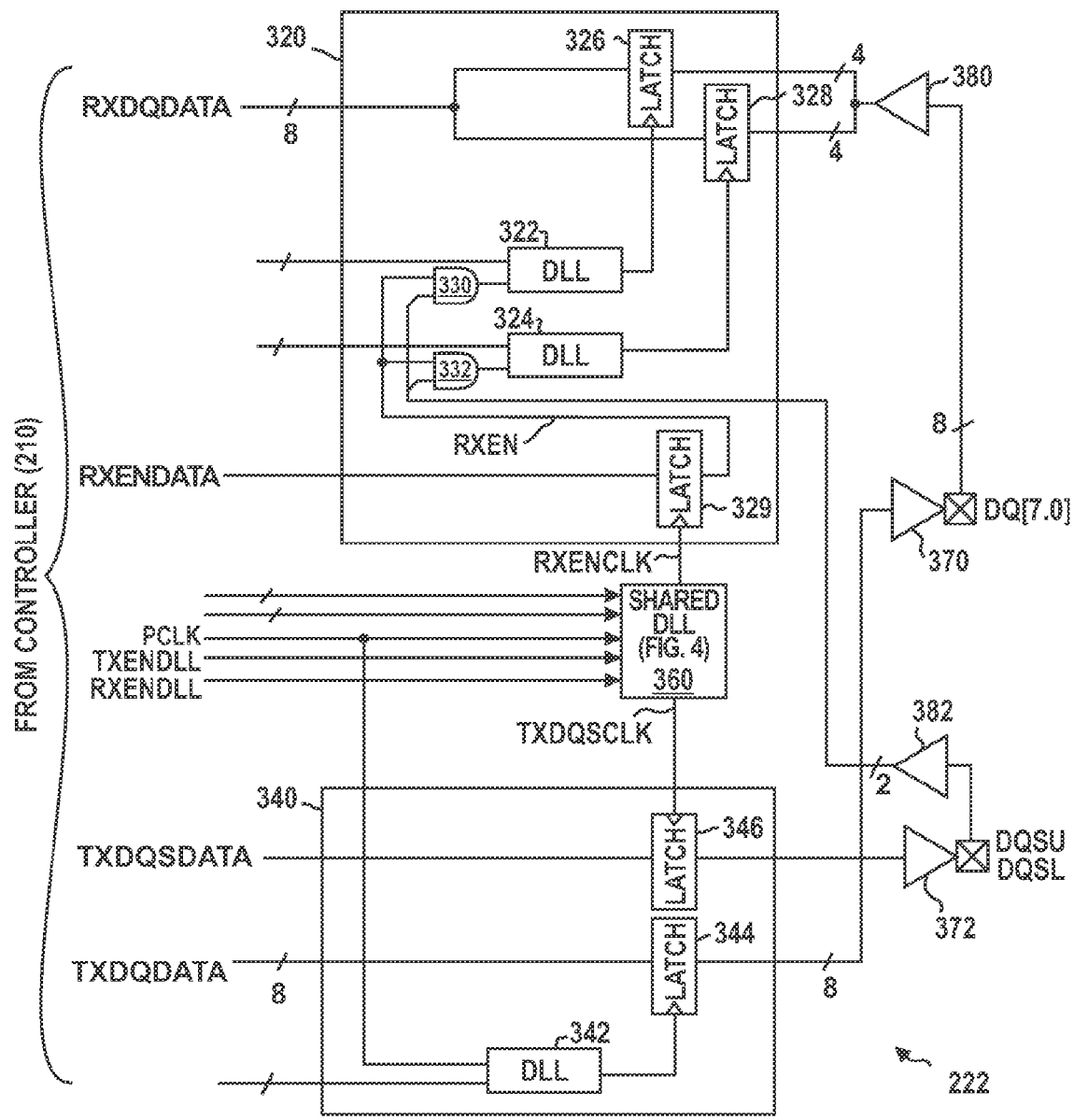
FIG. 3 illustrates in partial block diagram and partial logic diagram form a byte lane transceiver of the DRAM controller of FIG. 2.
Figure 4:
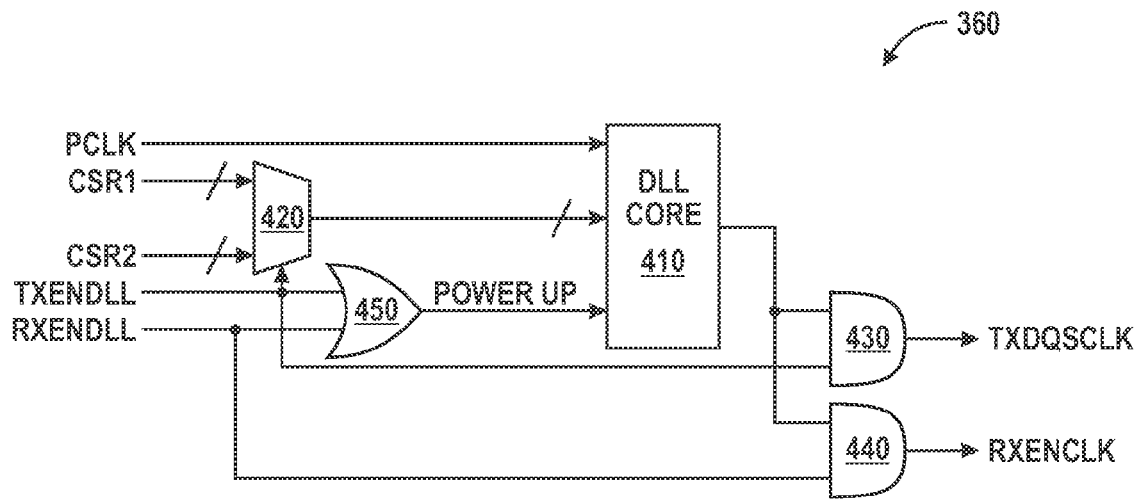
FIG. 4 illustrates in partial block diagram and partial logic diagram form the shared DLL of FIG. 3.

However DRAM controller 114 uses a shared DLL for both the read path and the write path. Thus DRAM controller 114 is more efficient in terms of circuit area than known DRAM controllers. DRAM controller 114 dynamically updates the delay value provided to the shared DLL depending on whether it is currently performing a function in the read path or the write path. FIGS. 2-4 below further illustrate additional details of the structure of DRAM controller 114 and the use and advantages of the shared DLL.

FIG. 2 illustrates in block diagram form DRAM controller 114 of FIG. 1. DRAM controller 114 generally includes a controller 210 and a transceiver 220. Controller 210 has an input for receiving a processor clock signal labeled "PCLK", a first bidirectional connection to CPU 112 (not shown in FIG. 2), and a second bidirectional connection that conducts control and data signals, including sixty-four bits of data and eight ECC bits for a total of seventy-two bits. Additional details relating to the interface between controller 210 and CPU 112 are not shown in FIG. 2.

Transceiver 220 includes eight byte-lane transceivers including representative byte-lane transceivers 222, 224, and 226, and one ECC transceiver 228. Each transceiver provides and receives eight bits of processor data through controller 210, and receives signal PCLK, and configuration data and operation commands from controller 210 (not shown in FIG. 2). Each transceiver is connected to memory interface 120 of FIG. 1 for conducting corresponding memory data and memory data strobe signals. Byte-lane transceiver 222 includes bidirectional terminals to conduct a set of memory data signals labeled "DQ[7:0]" and a set of memory data strobe signals labeled "$DQS_0$". Byte-lane transceiver 224 includes bidirectional terminals to conduct a set of memory data signals labeled "DQ[15:8]" and a set of memory data strobe signals labeled "$DQS_1$". Byte-lane transceiver 226 includes bidirectional terminals to conduct a set of memory data signals labeled "DQ[63:57]" and a set of memory data strobe signals labeled "$DQS_7$". ECC transceiver 228 includes bidirectional terminals to conduct a set of memory data signals labeled "ECC[7:0]" and a set of memory data strobe signals labeled "$DQS_E$". Each of signals $DQS_{(X)}$ are implemented as two signals: an upper-nibble signal labeled "$DQSU_{(X)}$" and a lower-nibble signal labeled "$DQSL_{(X)}$." Note that DRAM controller 114 uses signal $DQSU_{(X)}$ as an upper data strobe signal if ×4 DDR memory is selected, but as a data mask signal if ×8 or ×16 memory is selected. These signals are used within each byte-lane transceiver as single-ended signals. However during a memory write operation, these single ended signals are converted into differential signal pairs and provided to memory interface 120, and during a memory read operation, these signals are received at memory interface 120 as differential signal pairs and are converted into single-ended signals by a differential amplifier (not shown).

FIG. 3 illustrates in partial block diagram and partial logic diagram form byte-lane transceiver circuit 222 of DRAM controller 114 of FIG. 2. Byte-lane transceiver 222 includes a read path circuit 320, a write path circuit 340, a shared DLL 360, line drivers 370 and 372, and line receivers 380 and 382.

Read path circuit 320 includes an upper-nibble DLL 322, a lower-nibble DLL 324, AND gates 330 and 332, and latches 326, 328 and 329. Latch 329 has a data input for receiving a signal labeled "RXENDATA" from controller 210, a clock input for receiving a signal labeled "RXENCLK" from shared DLL 360, and an output labeled "RXEN". AND gate 330 has a first input, a second input for receiving signal RXEN, and an output. AND gate 332 has a first input, a second input for receiving signal RXEN, and an output. DLL 322 has a clock input connected to the output of AND gate 330, a second input for receiving a delay selection value from controller 210, and an output for providing a time delayed version of the upper-nibble memory data strobe signal DQSU. DLL 324 has a clock input connected to the output of AND gate 332, a second input for receiving a delay selection value from controller 210, and an output for providing a time delayed version of the lower-nibble memory data strobe signal DQSL. Latch 326 has a data input, a clock input connected to the output of DLL 322, and an output for providing four bits of an 8-bit data signal labeled "RXDQDATA" to controller 210. Latch 328 has a data input, a clock input connected to the output of DLL 324, and an output for providing the other four bits of RXDQDATA to controller 210. Latches 326 and 328 are dual-edge latches wherein input data is latched on the rising edge as well as on the falling edge of the clock signals provided by DLL 322 and 324, respectively. A multiplexer incorporated in each of latches 326 and 328 provides the appropriate latched data to the latch output terminal based upon the logic level of the input clock.

Write path circuit 340 includes a DLL 342, and latches 344 and 346. DLL 342 has a first input for receiving signal PCLK, a second input for receiving a delay selection value from controller 210, and an output. Latch 344 has a data input for receiving a signal labeled "TXDQDATA", a clock input connected to the output of DLL 342, and an output. Latch 346 has a data input for receiving a signal labeled "TXDQSDATA" from controller 210, a clock input for receiving a signal labeled "TXDQSCLK" from shared DLL 360, and an output.

Shared DLL 360 is shared and utilized by read path circuit 320 during read cycles and also by write path circuit 340 during write cycles. Shared DLL 360 has a first input for receiving a first delay selection value, a second input for receiving a second delay selection value, a third input for receiving signal PCLK, fourth and fifth inputs for respectively receiving signals labeled "TXENDLL" and "RXENDLL" from controller 210, a first output for providing signal RXENCLK, and a second output for providing signal TXDQSCLK.

Line driver 370 has an input connected to the output of latch 344 and an output for providing signal DQ[7:0] to memory interface 120. Line driver 372 has an input connected to the output of latch 346 and an output for providing the upper-nibble memory data strobe signal DQSU and the lower-nibble memory data strobe signal DQSL to memory interface 120. Line receiver 380 has an input for receiving the upper-nibble of DQ[7:0] (i.e. DQ[7:4]), and the lower-nibble of DQ[7:0] (i.e. DQ[3:0]) from memory interface 120 and an output connected to the data inputs of latches 326 and 328. Line receiver 382 has an input for receiving the differential versions of the upper-nibble memory data strobe signal DQSU and lower-nibble memory data strobe signal DQSL from memory interface 120, and an output connected to the first input of AND gate 330 for providing a single-ended upper-nibble memory data strobe and to the first input of AND gate 332 for providing a single-ended lower-nibble memory data strobe.

During a read operation, DLLs 322 and 324 delay memory data strobe signals DQSU and DQSL, respectively to capture the incoming data with adequate setup and hold time for the proper operation of latches 326 and 328. Having been successfully captured, the latched data is made available to controller 210 as RXDQDATA. During the read operation, controller 210 enables shared DLL 360 by activating signal RXENDLL while keeping signal TXENDLL inactive, and shared DLL 360 subsequently activates signal RXENCLK after a delay determined by the value received on the first input. As previously described, transceiver 222 receives differential signal versions of memory data strobe signals DQSU and DQSL, but converts them into single-ended signals for use by the byte-lane transceiver. Byte-lane transceiver 222 at FIG. 3 supports ×4 DDR memories. Read path circuit 320 would only require one of DLLs 322 and 324 to support ×8 DDR memories.

During the read operation, transceiver 222 uses DLLs 322 and 324 to appropriately delay the incoming memory data strobe signals DQSU and DQSL to capture the incoming data DQ[7:0] at the appropriate point in time. To understand why the appropriate timing is difficult to achieve, note DRAM memory 130 conforms to DDR standards that specify that the DDR memory transmit the requested data with the data transitions aligned with the transitioning of the memory data strobe signal that it also is transmitting. The memory interface operates at a data rate that can exceed 800 MHZ. This high speed causes relatively poor signal integrity of the incoming data signals, requiring latches 326 and 328 to capture them at an appropriate point in time, somewhere near the center of the incoming data transition interval. The small portion of time that all four bits of incoming data are valid and can be captured is usually referred to as the data "eye". The width of the eye represents the period of time that the data is valid and the height of the eye represents the voltage range of the valid data. Signal integrity degradation limits the width and the height of the eye.

Moreover, DDR memory may be placed on computer motherboards in any one of multiple dual inline memory module (DIMM) slots. If microprocessor 110 attempts to access a DRAM in the closest memory slot, the physical distance will cause the delay to be shorter than if microprocessor 110 attempts to access a DRAM in the farthest memory slot. In addition, different memory chips introduce variable amounts of skew between memory data signal DQ and memory data strobe signal DQS. Data processing system 100 accommodates the different skews and different distribution characteristics by training different values for the delay select signal according to which memory slot is accessed. Thus controller 210 provides the delay select values that are appropriate and are used by DLLs 322 and 324, which generate clocks for latches 326 and 328 that are centered on the eye for each DRAM.

During a write operation, write path circuit 340 and shared DLL 360 provide a suitably time-delayed version of the processor data signal DQ[7:0] and corresponding memory data strobe signals DQSU and DQSL to memory interface 120. During the write operation, controller 210 enables shared DLL 360 by activating signal TXENDLL while keeping signal RXENDLL inactive, and shared DLL 360 subsequently activates signal TXENCLK after a delay determined by the value received on its second input. Signal TXDQSCLK determines the timing of memory data strobe signals DQSU and DQSL. As previously described, transceiver 222 converts single ended signals DQSU and DQSL into differential signal pairs before being provided to interface 120.

During the write operation, byte-lane transceiver 222 provides data signal DQ[7:0] and memory data strobe signals DQSU and DQSL with a timing relationship established by DLL 342 and shared DLL 360. Controller 210 sets an appropriate timing relationship between the transmitted data and memory data strobe signals so that the memory data strobe signal transition occurs centered on the interval between data signal transitions. This timing relationship is determined through a calibration procedure performed by the BIOS after power is initially supplied to the system and reset is performed.

The DDR standard requires read and write operations to be separated by a delay equal to the period of only two DQS cycles. Shared DLL 360 transitions between support of read path circuit 320 and support of write path circuit 340 within this time period. Shared DLL 360 switches to providing the alternate one of outputs TXDQSCLK and RXENCLK. The architecture of shared DLL 360 allows rapid switching between modes so that the transition occurs within about a single DQS cycle, and this architecture will be described further with respect to FIG. 4 below.

Shared DLL 360 thus performs the functions of two individual DLLs, reducing system costs and increasing system performance. Note that in DRAM controller 114, each byte lane transceiver has a structure substantially the same as transceiver 222, and thus DRAM controller 114 uses nine fewer DLLs than what is needed to replicate the total number of unique delays. DRAM controller 116 uses shared DLLs in each byte lane transceiver in a similar fashion. Needing only four DLLs instead of five per byte lane also allows the transceivers to be laid out in a more symmetrical fashion.

FIG. 4 illustrates in partial block diagram and partial logic diagram form shared DLL 360 of FIG. 3. Shared DLL 360 includes DLL core 410, multiplexer 420, AND gates 430 and 440, and OR gate 450. DLL core 410 has a clock input for receiving signal PCLK, a delay select input, a power up control input, and an output. Multiplexer 420 has a first input for receiving a read-enable delay selection value signal labeled "CSR1", a second input for receiving a transmit DQS delay selection value signal labeled "CSR2", a third input for receiving a select signal labeled "TXENDLL", and an output connected to the second input of DLL core 410. OR gate 450 has a first input for receiving signal TXENDLL, a second input for receiving signal RXENDLL, and an output connected to the power up control input of DLL core 410. AND gate 430 has a first input connected to the output of DLL core 410, a second input for receiving signal TXENDLL, and an output for providing signal TXDQSCLK. AND gate 440 has a first input connected to the output of DLL core 410, a second input for receiving signal RXENDLL, and an output for providing signal RXENCLK.

During a read operation, signal RXENDLL is active and signal TXENDLL is inactive. Signal RXENDLL configures multiplexer 420 to provide read-enable delay selection value signal CSR1 to DLL core 410. Signal CSR1 represents a time delay value stored in a register within controller 210 and configures DLL core 410 to enable signal RXENCLK to enable latches 326 and 328 of read patch circuit 320 at the appropriate time.

During a write operation, signal TXENDLL is active and signal RXENDLL is inactive. Signal TXENDLL configures multiplexer 420 to provide transmit DQS delay selection value signal CSR2 to DLL core 410. Signal CSR2 represents a time delay value stored in a register within controller 210 and configures DLL core 410 to enable signal TXDQSCLK to enable latch 346 of write path circuit 340 at the appropriate time.

As previously described, shared DLL 360 responds to signals TXENDLL and RXENDLL, and switches from providing a delay specified by either one of signals CSR1 and CSR2 during a period of about one DQS cycle.

It should be appreciated that DLL core 410 can be implemented using any of a variety of known DLL architectures. For example, DLL core 410 can be implemented as a DLL that uses $2^N$ sequential delay stages and an N-bit delay selection signal. DLL core 410 can also be implemented as a multiplying DLL or as a recirculating DLL.

Figure 5:
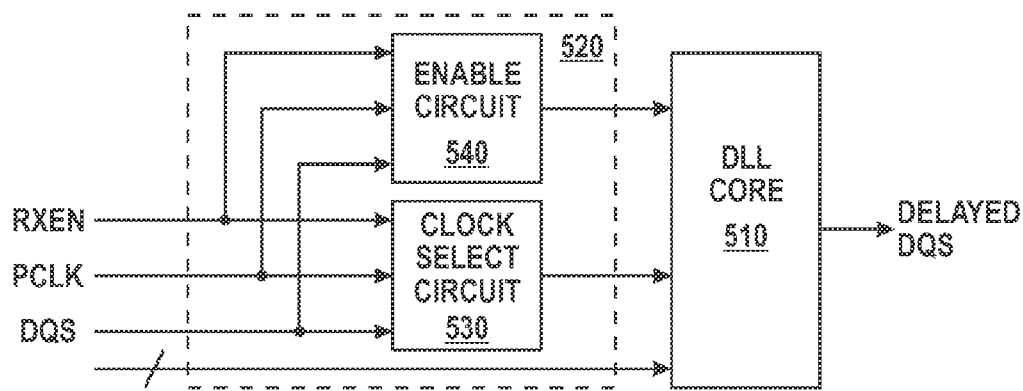
FIG. 5 illustrates in partial block diagram and partial logic diagram form a DLL that can be used as either of the read DQS DLLs of FIG. 3.

FIG. 5 illustrates in partial block diagram form a DLL 500 that can be used as either DLL 322 or DLL 324 of FIG. 3. DLL 500 includes a DLL core 510 and a DLL control circuit 520. DLL core 510 has a clock input, a delay select input for receiving signal labeled "CSR", an enable and configuration control input, and an output for providing a signal labeled "DELAYED DQS". DLL control circuit 520 includes a clock select circuit 530 and an enable circuit 540. Clock select circuit 530 has an enable input for receiving RXEN, a first clock input for receiving signal PCLK, a second clock input for receiving signal DQS, and an output connected to the clock input of DLL core 510. Enable circuit 540 has a first clock input for receiving signal PCLK, a second clock input for receiving signal DQS, and enable input for receiving RXEN, and an output for providing control information connected to the enable and configuration control input of DLL core 510.

During a read operation, controller 210 of FIG. 2 activates signal RXEN. Clock select circuit 530 is responsive to signal RXEN to provide a clock derived from DQS to the clock input of DLL core 510. DLL core 510 is configured by a receive-DQS delay line select value received as signal CSR to suitably delay DQS to capture incoming memory read data DQ latches 326 and 328 with adequate setup and hold time.

Enable circuit 540 is responsive to signal DQS to enable DLL core 510 during at least a portion of the read cycles in a read burst that includes some but not all of the edges of DQS. In DDR memory systems the initial rising edge of DQS and the initial falling edge of DQS are susceptible to a considerable amount of jitter. During a burst of length four, enable circuit 540 uses a third edge and a fourth edge of DQS. During a burst of length eight, enable circuit 540 uses a third edge, a fourth edge, a seventh edge, and an eighth edge.

Using some but not all of the edges of DQS allows DLL core 510 to remain locked during long series of bursts, in which loop filters typically tend to lose charge and DLLs tend to lose lock. Moreover enable circuit 540 selects particularly stable edges of DQS while ignoring other edges that tend to be susceptible to jitter. Finally enable circuit 540 only enables DLL core 510 to lock during some edges, saving power that would otherwise be required to lock on all edges.

In order to increase system performance during memory read operations while minimizing circuit area and cost, DLL 500 maintains lock during a series of read bursts by utilizing timing information derived from the DQS signal itself. The derived timing information is used to lock the DLL by effectively serving as the reference clock that keeps DLL 500 locked. Locking using DQS is possible because the DQS signal provided by the DDR memory is transmitted synchronously with the signal MEMCLK provided by DRAM controller 114. MEMCLK is, in turn, synchronous to clock PCLK and has a frequency of one half that of PCLK. Even though the memory data strobe signal DQS provided by the DDR memory is ultimately synchronous to clock PCLK, it is not a free running clock that would typically be available to lock a DLL. Instead DQS is only transmitted by DDR memory during read bursts. Moreover, the frequency of DQS is one half of PCLK, and thus DLL 500 will need to account for this difference in frequency. Furthermore, signal DQS exhibits a distorted duty cycle. The distorted duty cycle is partially due to the fact that the voltage swing of signal DQS is different at the beginning of a DQS burst, following the DQS preamble, than it is during subsequent cycles. The first rising edge of DQS following the preamble also exhibits inferior signal integrity.

To circumvent this as well as other duty cycle distortion, enable circuit 540 selects only certain edges of the incoming DQS signal on which to lock. Enable circuit 540 enables the phase detector within DLL core 510 to lock DLL core 510 only on these selected edges. During a read burst of four, enable circuit 540 selects the third and fourth edges of DQS, which are the second rising edge and the second falling edge after the DQS preamble. The phase detector of DLL core 510 is selectively provided with the incoming DQS signal as well as a delayed version of the incoming DQS signal, the delay being one PCLK cycle when DLL core 510 is successfully locked. Thus the phase detector of DLL core 510 compares the second rising edge of the incoming DQS signal with the first falling edge of the delayed DQS signal, and compares the second falling edge of the incoming DQS signal with the second rising edge of the delayed DQS signal. During a read burst of eight, enable circuit 540 selects the third, fourth, seventh, and eighth edges of DQS. Comparing the first falling edge of the incoming DQS signal to the first rising edge of the delayed DQS signal is not advised due to the previously mentioned signal distortions. Moreover, the first rising edge of the incoming DQS signal cannot be used due to the previously mentioned distortion, but also because there is no delayed DQS signal edge available to which it can be compared. By comparing an equal number of DQS rising edges to DQS falling edges, the effects of duty cycle distortion are eliminated.

When a read operation is not being performed, controller 210 deactivates signal RXEN and DLL control circuit 520 is configured to be responsive to processor clock signal PCLK, and PCLK is provided to the clock input of DLL core 510. DLL core 510 is locked to the incoming PCLK signal, and maintains lock to PCLK until the next read operation is enabled, at which time DLL core 510 switches to using DQS to maintain lock. In order to reduce operating power requirements, enable circuit 540 utilizes only a portion of the incoming PCLK cycles for the purpose of maintaining lock.

By utilizing signal DQS to lock DLLs 322 and 324 during read operations, there is no need to interrupt long read bursts in order to perform periodic DLL relocking, nor to duplicate the receive-DQS DLLs to implement a Gatling gun or replica DLL solution. Thus, memory-read performance is not reduced as would occur if read bursts were interrupted, and system cost is not increased by implementing duplicate DLLs (replicated for each nibble of each byte-lane transceiver).

It should be appreciated that DLL core 510 can be implemented using any of a variety of known DLL architectures. For example, DLL core 510 can be implemented as a conventional DLL that uses $2^N$ sequential delay stages and an N-bit delay selection signal. DLL core 510 can also be implemented as a multiplying DLL or as a recirculating DLL.

Figure 6:
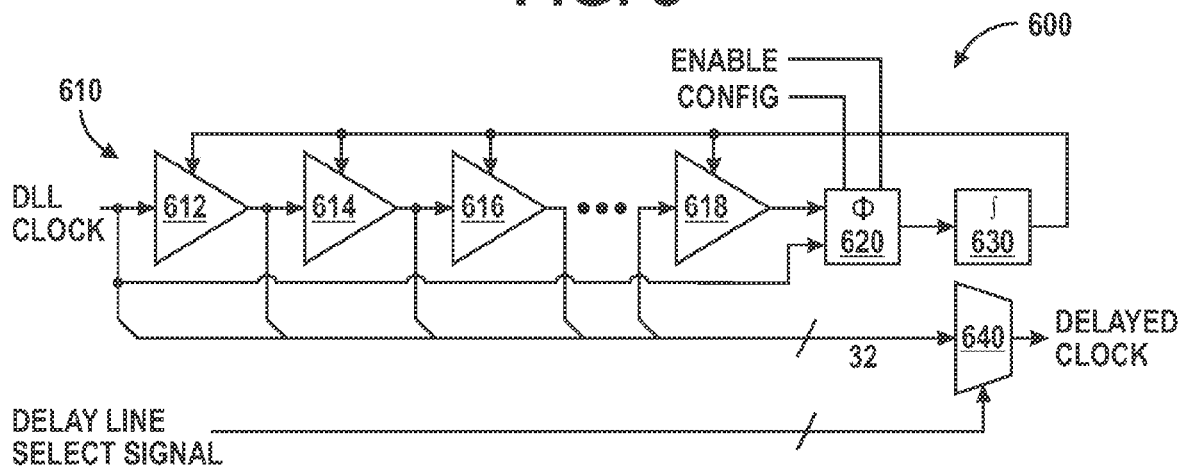
FIG. 6 illustrates in partial block diagram and partial logic diagram form a DLL core that can be used in the DLL of FIG. 5.

FIG. 6 illustrates in partial block diagram and partial logic diagram form a DLL core 600 that can be used in DLL 500 of FIG. 5. DLL core 600 includes generally a delay chain 610, a phase detector 620, a loop filter 630, and a multiplexer 640. Delay chain 610 includes a set of thirty-two series-connected delay cells. FIG. 6 shows four representative delay cells 612, 614, 616, and 618. Delay cell 612 has a signal input for receiving signal labeled "DLL CLOCK", a feedback input, and an output. Delay cell 614 has a signal input connected to the output of delay cell 612, a feedback input, and an output. Delay cell 616 has a signal input connected to the output of delay cell 614, a feedback input, and an output. The output of delay cell 616 is connected to the input of a subsequent delay cell (not shown) and a series connection of additional delay cells (not shown), until a total of thirty-two delay cells are connected. The last delay cell 618 (thirty-second) has an input connected to the output of a previous (thirty-first) delay cell, a feedback input, and an output. Phase detector 620 has a first clock input for receiving signal DLL CLOCK, a second clock input connected to the output of delay cell 618, and enable input for receiving a signal labeled "ENABLE", a configuration control input for receiving a signal labeled "CONFIG", and an output. Loop filter 630 has an input connected to the output of phase detector 620, and an output connected to the feedback terminals of all thirty-two delay cells of delay chain 610. Multiplexer 640 has thirty-two data inputs in which the first data input receives signal DLL CLOCK, and the remaining data inputs are connected to outputs of the first thirty-one delay cells of delay chain 610, a select input for receiving signal labeled "DELAY LINE SELET SIGNAL", and an output providing the signal labeled "DELAYED CLOCK".

The general function of phase detector 620 and loop filter 630 is to provide a control voltage at the output of loop filter 630 which configures the delay of each delay cell of delay chain 610, such that the sum of the individual delay of all thirty-two delays cells is equal to the clock period of signal DLL CLOCK. When DLL core 600 is locking to PCLK, phase detector 620 is locking to the period of PCLK. When DLL core 600 is locking to DQS, phase detector 620 is effectively locking on the period of time between a rising and falling edge, or the time between a falling and a rising edge of DQS. The delay of each delay cell can be varied and is determined by the bias voltage provided to its feedback input. In operation, if the sum of the individual delays of the thirty-two delay cells exceeds the clock period of signal DLL CLOCK, then phase detector 620 and loop filter 630 alter the feedback control bias voltage applied to feedback input of each delay cell so as to reduce the delay provided by each delay cell, until the total delay provided by all thirty-two delay cells is once again equal to the period of signal DLL CLOCK. Similarly, if the sum of the individual delays of the thirty-two delay cells is smaller than the clock period of signal DLL CLOCK, then phase detector 620 and loop filter 630 alter the control bias voltage applied to the feedback input of each delay cell so as to increase the delay provided by each delay cell, until the total delay provided by all thirty-two delay cells is once again equal to the period of signal DLL CLOCK. When the total delay provided by all thirty-two delay cells is equal to the period of signal DLL CLOCK, then shared DLL core 600 is said to be in a "locked" condition. When DLL core 600 is in the locked condition, then the output of each delay cell provides a copy of signal DLL CLOCK time-skewed by an approximately equal fraction of one DLL CLOCK period. Thirty-one unique time-delayed versions of signal DLL CLOCK are available, and provided to multiplexer 440. The first data input of multiplexer 640 receives the un-delayed signal DLL CLOCK. The second data input of multiplexer 640 receives a copy of signal DLL CLOCK that is delayed by $\frac{1}{32}^{nd}$ of the clock period of signal DLL CLOCK. The third data input of multiplexer 640 receives a copy of signal DLL CLOCK that is delayed by $\frac{2}{32}^{nd}$ of the clock period of signal DLL CLOCK. The final and thirty-second data input of multiplexer 640 receives a copy of signal DLL CLOCK that is delayed by $\frac{31}{32}^{nd}$ of the clock period of signal DLL CLOCK. Signal DELAY LINE SELECT SIGNAL determines which one of the signals received on the data input of multiplexer 640 is provided at the output of multiplexer 640. The un-delayed signal DLL CLOCK can be selected as well as any of the thirty-one uniquely delayed versions of signal DLL CLOCK.

During operation, a time delay value provided by signal DELAY LINE SELECT SIGNAL configures multiplexer 640 to select the appropriate tap from delay chain 610 so as to provide output signal DELAYED CLOCK with the requested delay with respect to input signal DLL CLOCK. Enable circuit 540 provides the signals ENABLE and CONFIG to configure and selectively enable phase detector 620 to lock on selected DLL CLOCK clock edges.

DLL core 600 illustrates one possible implementation of a DLL. Another implementation is sometimes referred to as a recirculating DLL. The utilization of a recirculating DLL has some advantage when compared to the traditional DLL of FIG. 6. Instead of using thirty-two delay cells to implement the delay chain, a fewer number such as eight can be used. State machines or counters are used to regulate feedback of particular delay chain tap outputs signals to the input of delay chain 610, and to enable the DLL output after a certain number of recirculations. Such a technique can save circuit area and can allow a single DLL design to be used to provide a wide range of delay values while improving accuracy and stability despite the presence of manufacturing, process, voltage, and temperature variations. A delay cell interpolating multiplexer can also be used to effectively double the number of delay taps that would typically be available from a specific number of delay cells. The interpolating multiplexer supports selecting not only specific taps from delay chain 610, but also selecting an analog mix of any two adjacent taps. When two taps are mixed, a delay substantially halfway between the two taps is provided. All but the least significant bit of the delay selection signal is used to select a specific tap from delay chain 610. The least significant bit is used to enable mixing the signal provided by the selected tap with that of the next adjacent tap Wherein transceiver 222 shares a single DLL by both the write-path circuitry and the read-path circuitry, it should be appreciated that a second DLL can also be shared by the read path and write path circuitry. For example, whereas shared DLL 360 shares the write DQS and read enable delay functions, the second shared DLL could share the read DQS and write DQ delay functions. By extending the sharing to two DLLs, a byte-lane transceiver supporting ×4 DDR memories only requires three DLLs instead of five, and a byte-lane transceiver supporting ×8 or ×16 DDR memories (in which eight bits of data are locked to a single DQS) only requires two DLLs instead of four.

Moreover, while FIGS. 1-4 have illustrated the use of a shared DLL in the context of a DRAM controller, such a transceiver can be advantageous in other types of circuits. For example, a transceiver with a shared DLL could be used in the DRAM itself. Since future generations of DRAMs may require increasingly sophisticated signaling techniques but will likely remain cost-sensitive, using a transceiver with a shared DLL would be especially advantageous. Other uses of the transceiver will also be readily apparent to those of ordinary skill in the art.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A dynamic random access memory (DRAM) controller comprising:
    a delay locked loop (DLL) core having a first input for receiving a DLL clock signal, a second input for receiving a delay line select signal, and enable input, and an output for providing a delayed memory data strobe signal; and
    a DLL control circuit coupled to said DLL core for providing said DLL clock signal to said first input of said DLL core responsive to a memory data strobe signal during read cycles, for providing said DLL clock signal to said first input of said DLL core responsive to a processor clock signal during cycles other than said read cycles, and for enabling said DLL core to lock during at least a portion of said read cycles.

2. The DRAM controller of claim 1 wherein said DLL control circuit comprises:
    a clock select circuit having a first input for receiving said memory data strobe signal, a second input for receiving said processor clock signal, a control input for receiving a receive enable signal, and an output for providing said DLL clock signal; and
    an enable circuit having an output coupled to said enable input of said DLL core, wherein said enable circuit activates said output thereof to enable said DLL core to lock during at least said portion of said read cycles.

3. The DRAM controller of claim 2 wherein said enable circuit activates said output thereof to enable said DLL core to lock periodically during said cycles other than said read cycles.

4. The DRAM controller of claim 1 wherein in response to a read burst cycle comprising a plurality of read cycles that transfer data in synchronism with a corresponding plurality of edges of said memory data strobe signal, said DLL control circuit enables said DLL core to lock in response to some but not all of said corresponding plurality of edges of said memory data strobe signal.

5. The DRAM controller of claim 4 wherein said DLL control circuit enables said DLL core to lock for each of a rising edge of said memory data strobe signal and a falling edge of said memory data strobe signal during said read burst cycle.

6. The DRAM controller of claim 4 wherein said plurality of read cycles comprises four read cycles and wherein said some but not all of said corresponding plurality of edges of said memory data strobe signal comprises a third edge and a fourth edge.

7. The DRAM controller of claim 4 wherein said plurality of read cycles comprises eight read cycles and wherein said some but not all of said corresponding plurality of edges of said memory data strobe signal comprises a third edge, a fourth edge, a seventh edge, and an eighth edge.

8. The DRAM controller of claim 1 wherein said DLL core comprises:
    a tapped delay line having an input coupled to said first input of said DLL core, a feedback input, and a plurality of outputs ordered from a first output to a last output;
    a phase detector having a first input coupled to said first input of said DLL core, a second input coupled to said last output of said tapped delay line, a control input coupled to said enable input of said DLL core, and an output;
    a loop filter having an input coupled to said output of said phase detector, and an output coupled to said feedback input of said tapped delay line; and
    a multiplexer having an input coupled to said plurality of outputs of said tapped delay line, a control input for receiving said delay line select signal, and an output coupled to said output of said DLL core.

9. The DRAM controller of claim 1 further comprising:
    a latch having a signal input for receiving a memory data signal, a control input coupled to said output of said DLL core, and an output for providing a processor data signal.

10. The DRAM controller of claim 9 further comprising:
    a logic gate having a first input coupled to said output of said DLL core, a second input for receiving a receive enable clock signal, and an output coupled to said control input of said latch.

11. A receive circuit comprising:
    a delay locked loop (DLL) core having a first input for receiving a DLL clock signal, a second input for receiving a delay line select signal, and an output for providing a delayed data strobe signal;

a latch having a signal input for receiving an external data signal, a control input coupled to said output of said DLL core, and an output for providing an internal data signal; and a DLL control circuit for providing said DLL clock signal to said first input of said DLL core responsive to a memory data strobe signal while the receive circuit is in a first mode, and for providing said DLL clock signal to said first input of said DLL core responsive to a processor clock signal while the receive circuit is in a second mode.

12. The receive circuit of claim 11 wherein:

said DLL core further has an enable input; and said DLL control circuit has an output coupled to said enable input of said DLL core to enable said DLL core to lock during some but not all of the time that the receive circuit is in said first mode.

13. The receive circuit of claim 12 wherein said DLL control circuit activates said output thereof to enable said DLL core to lock periodically while the receive circuit is in said second mode.

14. The receive circuit of claim 12 wherein said DLL control circuit comprises:

a clock select circuit having a first input for receiving said external data strobe signal, a second input for receiving said internal clock signal, a control input for receiving a receive enable signal, and an output for providing said DLL clock signal; and an enable circuit having an output coupled to said enable input of said DLL core.

15. The receive circuit of claim 12 wherein said DLL core comprises:

a tapped delay line having an input coupled to said first input of said DLL core, a feedback input, and a plurality of outputs ordered from a first output to a last output;

a phase detector having a first input coupled to said first input of said DLL core, a second input coupled to said last output of said tapped delay line, an enable input coupled to said enable input of said DLL core, and an output;

a loop filter having an input coupled to said output of said phase detector, and an output coupled to said feedback input of said tapped delay line; and a multiplexer having an input coupled to said plurality of outputs of said tapped delay line, a control input for receiving said delay line select signal, and an output coupled to said output of said DLL core.

16. A method comprising:

receiving an external data signal in a first mode of operation;

receiving an external data strobe signal that times said external data signal in said first mode of operation;

latching said external data signal during said first mode of operation using an output of a delay locked loop (DLL) to provide an internal data signal;

locking said DLL using said external data strobe signal during said first mode of operation;

receiving an internal clock signal during a second mode of operation; and locking said DLL using said internal clock signal during said second mode of operation.

17. The method of claim 16 further comprising locking said DLL using each of a rising edge of said external data strobe signal and a falling edge of said external data strobe signal during said first mode of operation.

18. The method of claim 16 further comprising locking said DLL using only one of a rising edge of said internal clock signal and a falling edge of said internal clock signal during said second mode of operation.

19. The method of claim 16 wherein said locking said DLL using said internal clock signal during said second mode of operation comprises locking said DLL using said internal clock signal periodically during said second mode of operation.

20. The method of claim 16 wherein said locking said DLL using said external data strobe signal during said first mode of operation comprises locking said DLL during a read burst operation using some but not all edges of said external data strobe signal.

* * * * *